(12) United States Patent
Lorek et al.

(10) Patent No.: US 10,837,207 B2
(45) Date of Patent: Nov. 17, 2020

(54) CONTROL CENTER DOOR LATCH

(71) Applicant: Rockwell Automation Technologies, Inc., Mayfield Heights, OH (US)

(72) Inventors: Tomasz Lorek, Katowice (PL); Troy M. Bellows, Milwaukee, WI (US)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 370 days.

(21) Appl. No.: 15/824,714

(22) Filed: Nov. 28, 2017

(65) Prior Publication Data
US 2019/0161998 A1    May 30, 2019

(51) Int. Cl.
| | |
|---|---|
| *E05C 3/12* | (2006.01) |
| *E05F 11/54* | (2006.01) |
| *E05C 5/02* | (2006.01) |
| *H05K 7/18* | (2006.01) |
| *H05K 5/02* | (2006.01) |
| *E05B 41/00* | (2006.01) |
| *E05B 15/00* | (2006.01) |

(52) U.S. Cl.
CPC .............. *E05C 3/12* (2013.01); *E05B 41/00* (2013.01); *E05C 5/02* (2013.01); *E05F 11/54* (2013.01); *H05K 5/0221* (2013.01); *H05K 7/18* (2013.01); *Y10T 292/0863* (2015.04); *Y10T 292/1099* (2015.04)

(58) Field of Classification Search
CPC ......... Y10T 292/0863; Y10T 292/0864; Y10T 292/0867; Y10T 292/0869; Y10T 292/1099; E05C 5/00; E05C 5/02; E05C 5/04

USPC ................... 312/222, 334.4; 211/26; 109/57
See application file for complete search history.

(56) References Cited

U.S. PATENT DOCUMENTS 1,531,901 A * 3/1925 Clark ..................... E05D 13/06
                                                  292/59
1,603,159 A * 10/1926 Snyder ................ E05B 65/0864
                                                  292/62

(Continued)

FOREIGN PATENT DOCUMENTS

| AU | 495036 B2 | 11/1975 |
| CN | 1050596 A | 4/1991 |

(Continued)

OTHER PUBLICATIONS

European Patent Office, "Extended European Search Report", dated Apr. 1, 2019, pp. 1-8.

(Continued)

*Primary Examiner* — Carlos Lugo
(74) *Attorney, Agent, or Firm* — Kunzler Bean & Adamson

(57) ABSTRACT

For latching an equipment unit door of an equipment unit in a control center, an apparatus includes a latch pin, the unit socket, and a structure socket. The latch pin includes a latch shaft with a latch interface disposed on a pin proximal end and a latch wing disposed on a pin distal end. The latch pin rotates to one of an open position, a unit latch position, and a structure latch position. The unit socket passes the latch wing in the open position and obstructs the latch wing from moving in a proximal direction in the unit latch position. The structure socket passes the latch wing in the unit latch position and obstructs the latch wing from moving in the proximal direction in the structure latch position.

16 Claims, 17 Drawing Sheets

(56) References Cited

U.S. PATENT DOCUMENTS

| | | | |
|---|---|---|---|
| 1,672,333 A | 6/1928 | Miller | |
| 1,714,196 A * | 5/1929 | Vara | E05B 65/0864 |
| | | | 292/60 |
| 1,737,891 A * | 12/1929 | Parkins | E05B 65/0864 |
| | | | 292/60 |
| 1,792,537 A * | 2/1931 | Irwin | F16B 5/10 |
| | | | 411/349 |
| 2,631,877 A * | 3/1953 | Mark | E05B 17/2076 |
| | | | 292/57 |
| 2,831,520 A * | 4/1958 | Clarke | F16B 41/002 |
| | | | 411/349 |
| 2,877,637 A * | 3/1959 | Greenwald | E05C 5/02 |
| | | | 70/86 |
| 3,136,017 A * | 6/1964 | Preziosi | F16B 21/02 |
| | | | 411/552 |
| 3,179,457 A * | 4/1965 | Johnson | F16B 21/04 |
| | | | 292/195 |
| 3,407,454 A | 10/1968 | Myatt | |
| 3,446,046 A * | 5/1969 | Randel | G07F 9/10 |
| | | | 70/101 |
| 3,480,311 A * | 11/1969 | Lanham, Jr. | F16B 21/02 |
| | | | 403/408.1 |
| 3,798,935 A * | 3/1974 | Blekking | E05B 65/0864 |
| | | | 70/100 |
| 4,040,653 A * | 8/1977 | Takahashi | E05B 65/46 |
| | | | 292/202 |
| 4,570,467 A * | 2/1986 | Greco | E05B 65/0894 |
| | | | 292/346 |
| 5,275,029 A * | 1/1994 | Myers | E05B 35/008 |
| | | | 292/60 |
| 5,544,506 A * | 8/1996 | Nakano | E05B 67/36 |
| | | | 70/34 |
| 5,987,937 A * | 11/1999 | Lee | E05B 73/0005 |
| | | | 248/553 |
| 6,170,304 B1 | 1/2001 | Ohta | |
| 6,193,339 B1 * | 2/2001 | Behl | G11B 33/02 |
| | | | 312/223.2 |
| 6,357,806 B1 * | 3/2002 | Saku | E05B 63/143 |
| | | | 292/182 |
| 6,565,163 B2 * | 5/2003 | Behl | G11B 25/043 |
| | | | 312/223.1 |
| 6,628,512 B2 * | 9/2003 | Searby | G06F 1/181 |
| | | | 361/679.58 |
| 6,679,646 B2 * | 1/2004 | Quardt | H05K 5/0021 |
| | | | 24/573.09 |
| 7,699,365 B2 * | 4/2010 | Liang | E05B 41/00 |
| | | | 292/240 |
| 7,726,751 B2 * | 6/2010 | Bergmann | E05B 65/02 |
| | | | 312/222 |
| 7,850,013 B1 * | 12/2010 | Kramer | E05B 73/0082 |
| | | | 211/26 |
| 8,297,088 B1 * | 10/2012 | Zhang | G06F 1/182 |
| | | | 292/150 |
| 8,556,356 B2 * | 10/2013 | Anderson | G02B 6/4452 |
| | | | 211/26 |
| 2007/0085347 A1 | 4/2007 | Malkowski, Jr. et al. | |
| 2007/0085350 A1 | 4/2007 | Liang | |
| 2008/0036344 A1 * | 2/2008 | Johnson | E05B 63/244 |
| | | | 312/324 |
| 2009/0271950 A1 * | 11/2009 | Wang | E05B 1/0015 |
| | | | 16/415 |
| 2012/0097413 A1 | 4/2012 | Bugaris et al. | |
| 2015/0071730 A1 * | 3/2015 | Tseng | F16B 5/0208 |
| | | | 411/318 |

FOREIGN PATENT DOCUMENTS

| | | | |
|---|---|---|---|
| CN | 202251309 U | 5/2012 | |
| CN | 103062177 A | 4/2013 | |
| CN | 103917789 A | 7/2014 | |
| DE | 1871657 * | 9/1963 | |
| DE | 1955530 A1 * | 5/1971 | E05C 5/02 |
| DE | 19501660 A1 * | 7/1996 | H05K 7/1478 |
| FR | 687615 A | 8/1930 | |
| FR | 1026519 A | 4/1953 | |
| GB | 2219032 A | 11/1989 | |
| RU | 2125189 C1 | 1/1999 | |
| WO | 02/092443 A2 | 11/2002 | |

OTHER PUBLICATIONS 201811418315.2, Chinese Office Action, dated Aug. 26, 2020, pp. 1-8.

* cited by examiner

CONTROL CENTER DOOR LATCH

BACKGROUND INFORMATION

The subject matter disclosed herein relates to latching an equipment unit door for a control center.

BRIEF DESCRIPTION

An apparatus for latching an equipment unit door of an equipment unit in a control center is disclosed. The apparatus includes a latch pin, the unit socket, and a structure socket. The latch pin includes a latch shaft with a latch interface disposed on a pin proximal end and a latch wing disposed on a pin distal end. The latch pin rotates to one of an open position, a unit latch position, and a structure latch position. The unit socket passes the latch wing in the open position and obstructs the latch wing from moving in a proximal direction in the unit latch position. The structure socket passes the latch wing in the unit latch position and obstructs the latch wing from moving in the proximal direction in the structure latch position.

A system for latching an equipment unit door of an equipment unit in a control center is also disclosed. The system includes a structure, the equipment unit, a latch pin, the unit socket, and a structure socket. The latch pin includes a latch shaft with a latch interface disposed on a pin proximal end and a latch wing disposed on a pin distal end. The latch pin rotates to one of an open position, a unit latch position, and a structure latch position. The unit socket passes the latch wing in the open position and obstructs the latch wing from moving in a proximal direction in the unit latch position. The structure socket passes the latch wing in the unit latch position and obstructs the latch wing from moving in the proximal direction in the structure latch position.

A method for latching an equipment door of an equipment unit in a control center is also disclosed. The method passes the latch pin in an open position through a unit socket. The latch pin includes a latch shaft and a latch interface disposed on a pin proximal end and the latch wing disposed on a pin distal end. The latch pin rotates to one of an open position, a unit latch position, and a structure latch position. The method further rotates the latch pin to the unit latch position. The unit socket obstructs the latch wing from moving in a proximal direction in the unit latch position.

BRIEF DESCRIPTION OF THE DRAWINGS

In order that the advantages of the embodiments of the invention will be readily understood, a more particular description of the embodiments briefly described above will be rendered by reference to specific embodiments that are illustrated in the appended drawings. Understanding that these drawings depict only some embodiments and are not therefore to be considered to be limiting of scope, the embodiments will be described and explained with additional specificity and detail through the use of the accompanying drawings, in which.

DETAILED DESCRIPTION

Reference throughout this specification to "one embodiment," "an embodiment," or similar language means that a particular feature, structure, or characteristic described in connection with the embodiment is included in at least one embodiment. Thus, appearances of the phrases "in one embodiment," "in an embodiment," and similar language throughout this specification may, but do not necessarily, all refer to the same embodiment, but mean "one or more but not all embodiments" unless expressly specified otherwise.

The terms "including," "comprising," "having," and variations thereof mean "including but not limited to" unless expressly specified otherwise. An enumerated listing of items does not imply that any or all of the items are mutually exclusive and/or mutually inclusive, unless expressly specified otherwise. The terms "a," "an," and "the" also refer to "one or more" unless expressly specified otherwise.

The schematic flowchart diagrams and/or schematic block diagrams in the Figures illustrate the architecture, functionality, and operation of possible implementations. It should also be noted that, in some alternative implementations, the functions noted in the block may occur out of the order noted in the Figures. For example, two blocks shown in succession may, in fact, be executed substantially concurrently, or the blocks may sometimes be executed in the reverse order, depending upon the functionality involved. Although various arrow types and line types may be employed in the flowchart and/or block diagrams, they are understood not to limit the scope of the corresponding embodiments. Indeed, some arrows or other connectors may be used to indicate only an exemplary logical flow of the depicted embodiment.

The description of elements in each figure may refer to elements of proceeding figures. Like numbers refer to like elements in all figures, including alternate embodiments of like elements.

Figure 1A:
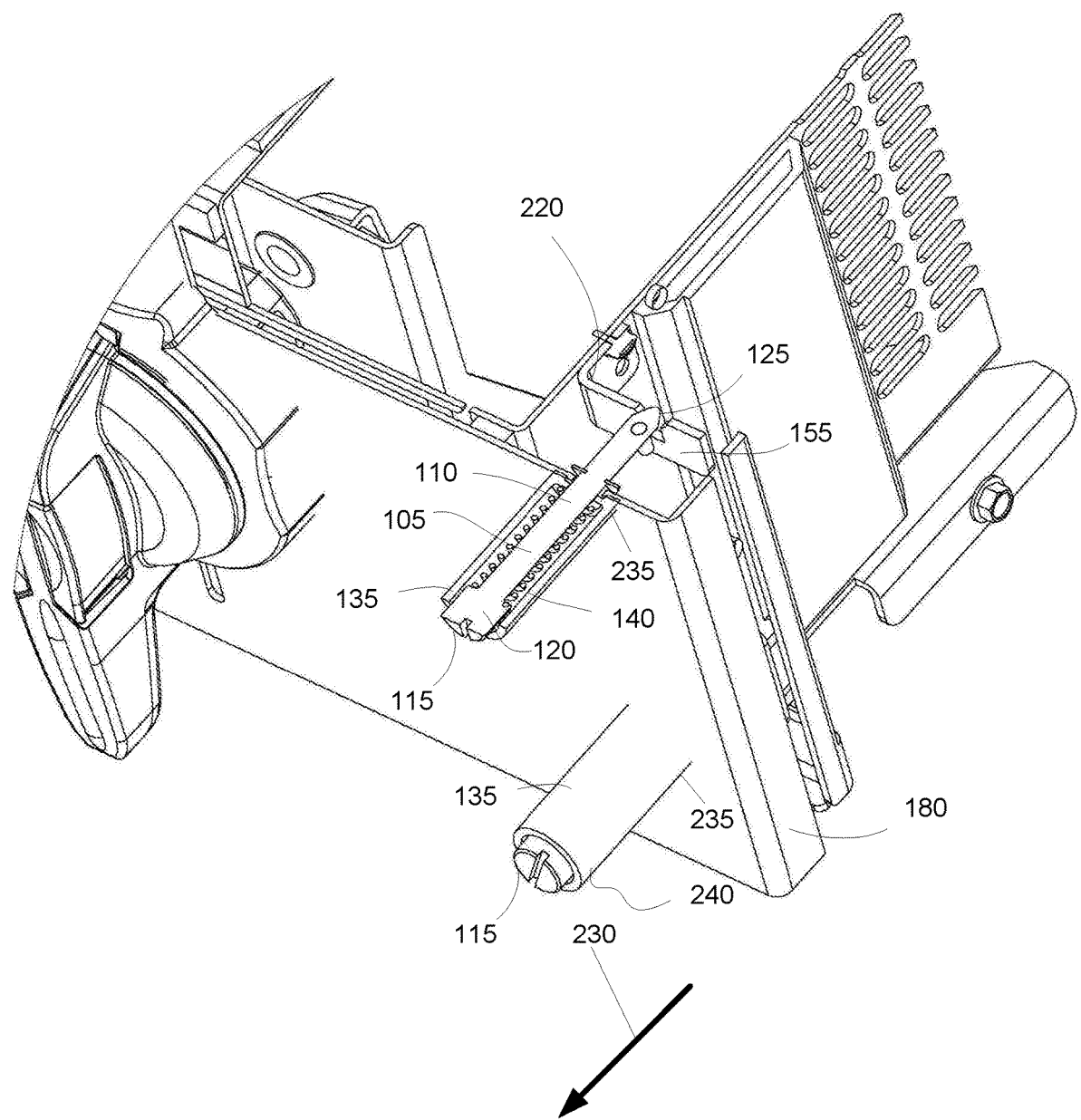
FIG. 1A is a perspective drawing of an equipment unit with latch apparatus according to an embodiment.

FIG. 1A is a perspective drawing of an equipment unit 185. The equipment unit 185 may reside in a control center. In one embodiment, the equipment unit 185 is disposed within a structure such as a rack, cabinet, and the like in the control center. The equipment unit 185 may house internal hardware (not shown) such as motor controllers, inverters, converters, power regulators, data processing hardware, and the like. The equipment unit 185 includes an equipment unit door 180. The internal hardware may be accessible by opening the equipment unit door 180. However, because the internal hardware may pose a safety risk, the equipment unit door 180 should be securely latched so that no user is inadvertently exposed to the internal hardware. In addition, the equipment unit 185 may be disposed in a structure. The equipment unit 185 should be latched to the structure so that the equipment unit 185 is not inadvertently removed from the structure.

The embodiments described herein securely latch the equipment unit door 180 to the equipment unit 185. In addition, the embodiments may securely latch the equipment unit 185 to the structure. In the depicted embodiment, the apparatus 100 includes a latch pin 105. The latch pin 105 may include a latch shaft 110 with a latch interface 115. The latch interface 115 may be disposed on a pin proximal end 120 of the latch pin 105. The latch pin 105 may further include a latch wing (not shown). The latch wing may be disposed on a pin distal end 125 of the latch pin 105. The latch pin 105 may rotate to one of an open position and a structure latch position as will be described hereafter. The latch pin 105 may latch the equipment unit door 180 to the equipment unit 185 in the unit latch position.

In one embodiment, the latch apparatus further includes a sleeve 135. The latch pin 105 may be disposed within the sleeve 135. A sleeve distal end 235 may be connected to the equipment door 180. In addition, the latch apparatus may include a biasing unit 140. In the depicted embodiment, the biasing unit 140 is a spring. The biasing unit 140 may bias the latch pin in a proximal direction 230 toward a sleeve proximal end 240. The biasing unit 140 may be selected from the group consisting of a coil spring, an elastic sleeve, and a torsion flange.

The latch apparatus may further include a unit socket 155. The unit socket 155 may be connected to the equipment unit 185. The unit socket 155 may be disposed on a unit bracket 220 and attached to the equipment unit 185. The latching of the latch pin 105 to the unit socket 155 and the structure socket will be described hereafter.

Figure 1B:
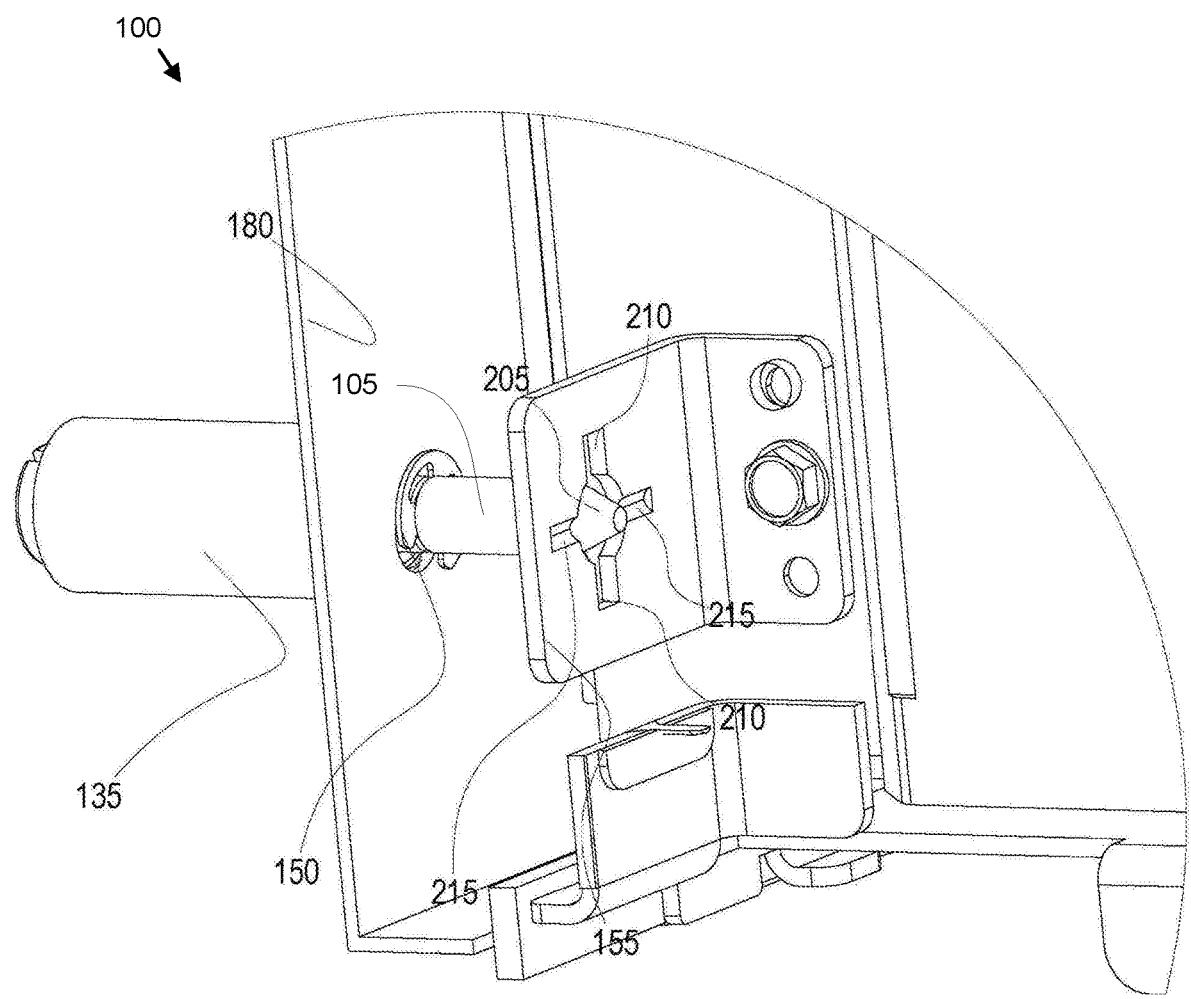
FIG. 1B is a perspective drawing of a latch apparatus according to an embodiment.

FIG. 1B is a perspective drawing of the latch apparatus 100. In the depicted embodiment, the latch pin 105 is shown passing through a center orifice 205 of the unit socket 155. The latch pin 105 may pass through the center orifice 205 of the unit socket 155 in an open position. The unit structure 155 further includes at least one polarized slot 210. Two polarized slots 210 are shown in the depicted embodiment. At least one latch wing (not shown) may pass through the polarized slot 210 as the latch pin 105 passes through the center orifice 205.

The unit structure 155 further includes at least one wing indentation 215. The latch wing may be disposed in the wing indentation during the unit latch position. As a result, the latch wing may be obstructed from moving in the proximal direction 230 while the latch pin 105 is in the unit latch position.

Figure 2A:
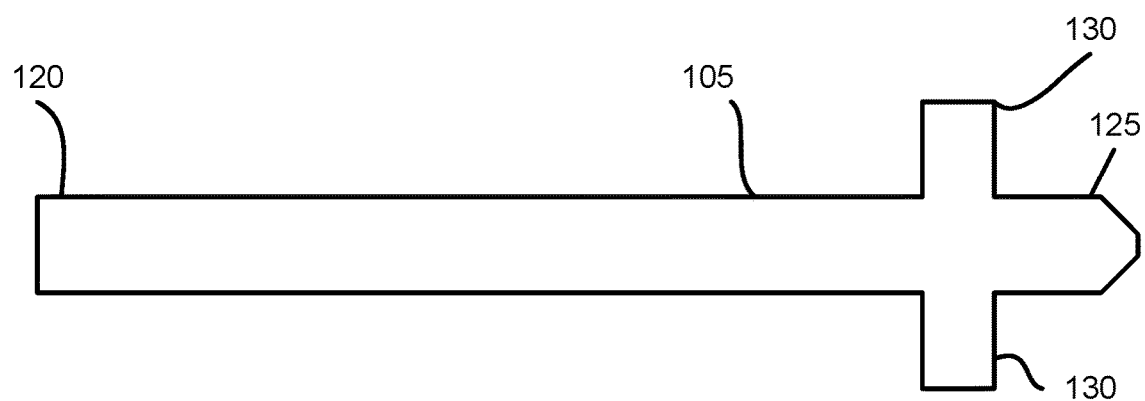
FIG. 2A is a side view drawing of a latch pin according to an embodiment.

FIG. 2A is a side view drawing of the latch pin 105. In the depicted embodiment, the latch pin 105 includes two latch wings 130. The latch wings 130 may be disposed within 0 to 5 centimeters of the pin distal end 125.

Figure 2B:
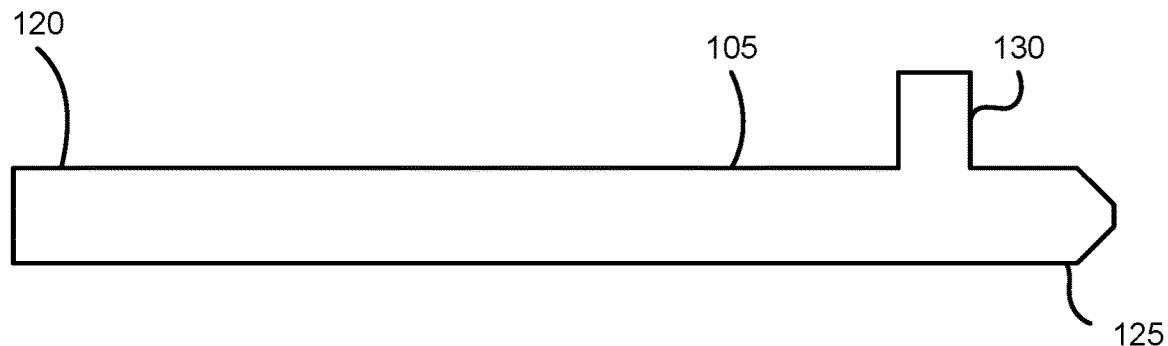
FIG. 2B is a side view drawing of a latch pin according to an alternate embodiment.

FIG. 2B is a side view drawing of an alternate embodiment of the latch pin 105. In the depicted embodiment, the latch pin 105 includes one latch wing 130.

Figure 2C:
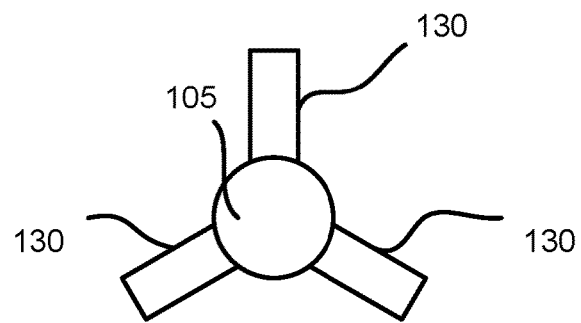
FIG. 2C is a front view drawing of a latch pin according to an alternate embodiment.

FIG. 2C is a front view drawing of an alternate embodiment of the latch pin 105. In the depicted embodiment, the latch pin 105 includes three latch wings 130. The latch pin 105 may include any number of latch wings 130.

Figure 2D:
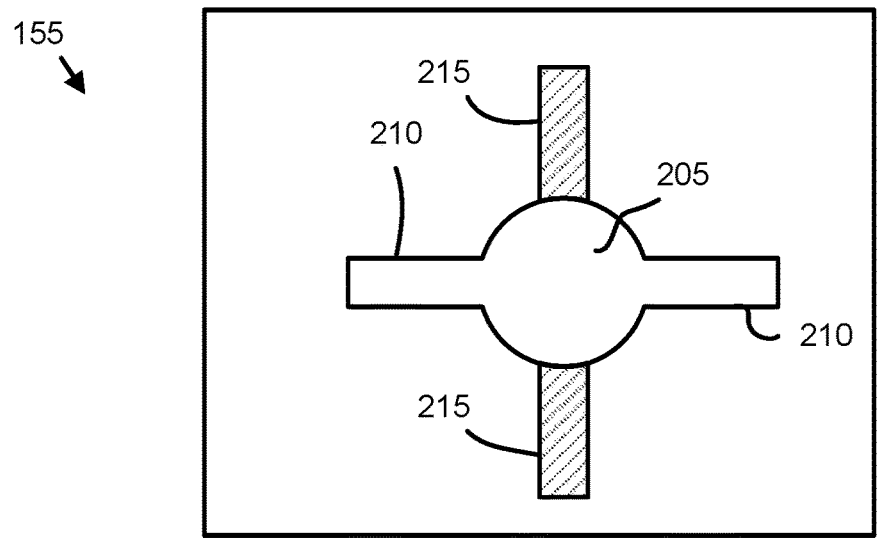
FIG. 2D is a front view drawing of the unit socket according to an embodiment.

FIG. 2D is a front view drawing of the unit socket 155. In the depicted embodiment, the unit socket 155 includes the center orifice 205, two polarized slots 210, and two wing indentations 215. In one embodiment, there is one polarized slot 210 and one wing indentation 215 for each latch wing 130. The center orifice 205 and the polarized slots 210 may permit the latch pin 105 and the latch wings 130 to pass through the unit socket 155 in the open position.

If the latch pin 105 rotates to the unit latch position, the wing indentations 215 may receive the latch wings 130. In one embodiment, the latch wings 130 may be biased into the wing indentations 215 by the biasing unit 140.

Figure 2E:
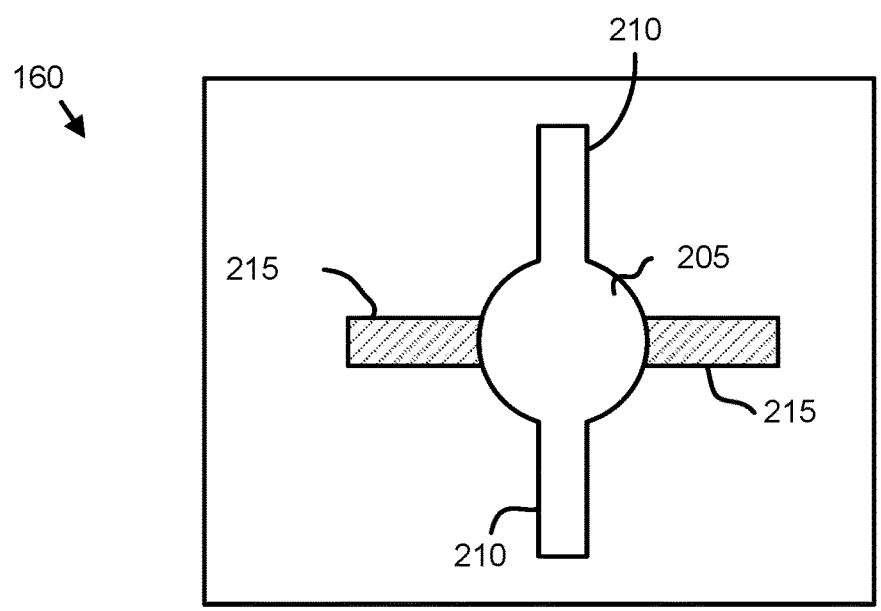
FIG. 2E is a front view drawing of a structure socket according to an embodiment.

FIG. 2E is a front view drawing of the structure socket 160. In the depicted embodiment, the structure socket 160 includes the center orifice 205, two polarized slots 210, and two wing indentations 215. In one embodiment, there is one polarized slot 210 and one wing indentation 215 for each latch wing 130.

In the depicted embodiment, the polarized slots 210 of the structure socket 160 not are aligned with the polarized slots 210 of the unit structure 155 of FIG. 2D. As a result, while the latch pin 105 and the latch wings 130 may pass through the unit socket in the open position, the latch pin 105 and the latch wings 130 may not pass through the structure socket 160 in the open position.

In addition, in the depicted embodiment, the polarized slots 210 of the structure socket 160 are aligned with the wing indentations 215 of the unit socket 155 of FIG. 2D. As a result, the latch pin 105 and the latch wings 130 may pass through the structure socket 160 in the unit latch position. The latch pin 105 may further rotate to a structure latch position, wherein the latch wings 130 are biased into the wing indentations 215 of the structure socket 160.

Figure 2F:
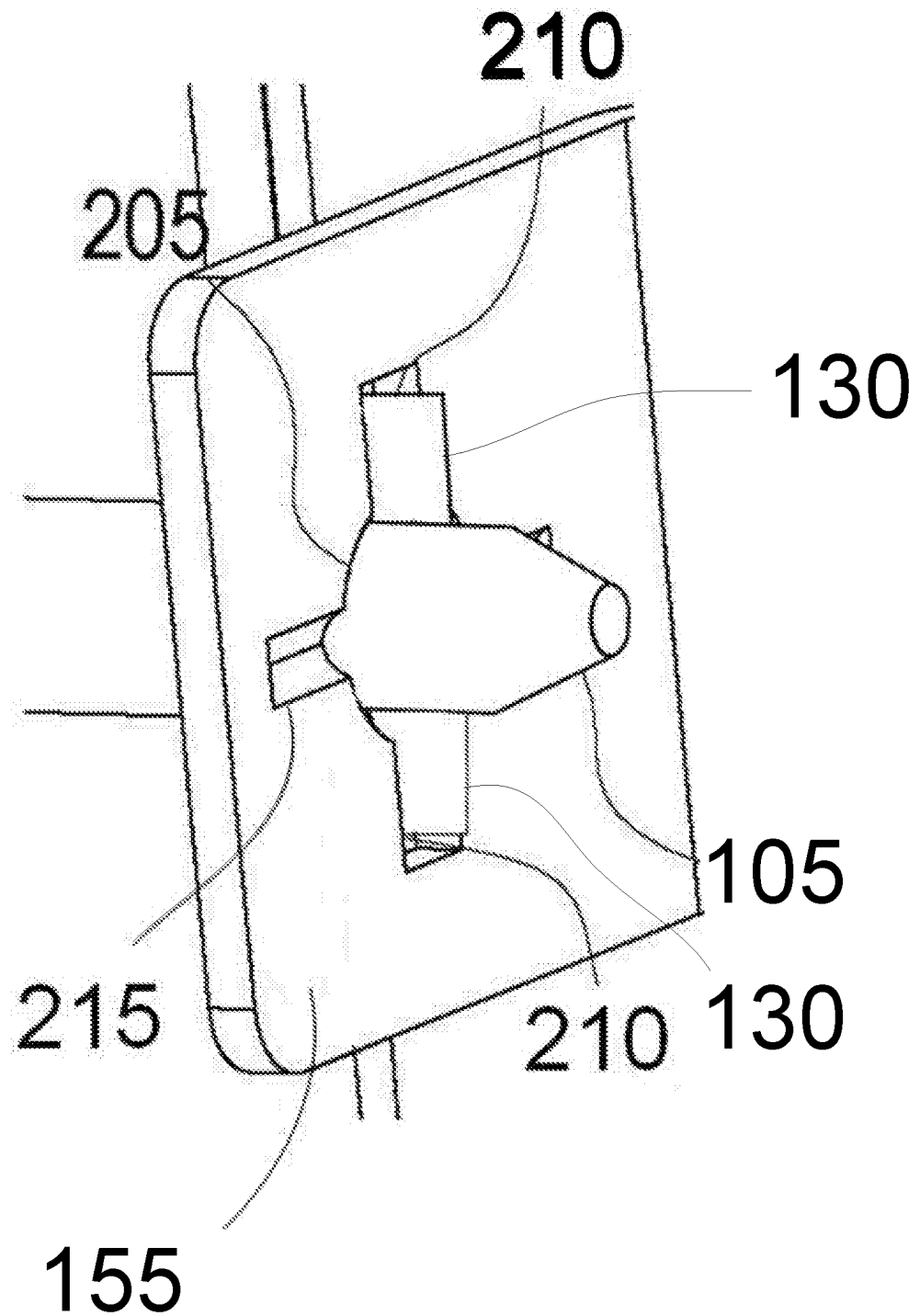
FIG. 2F is a perspective drawing of a unit socket according to an embodiment.

FIG. 2F is a perspective drawing of the unit socket 155. In the depicted embodiment, the latch pin 105 is in the open position. The latch pin 105 is shown passing through the center orifice 205. In addition, the latch wings 130 are shown passing through the polarized slots 210.

Figure 2G:
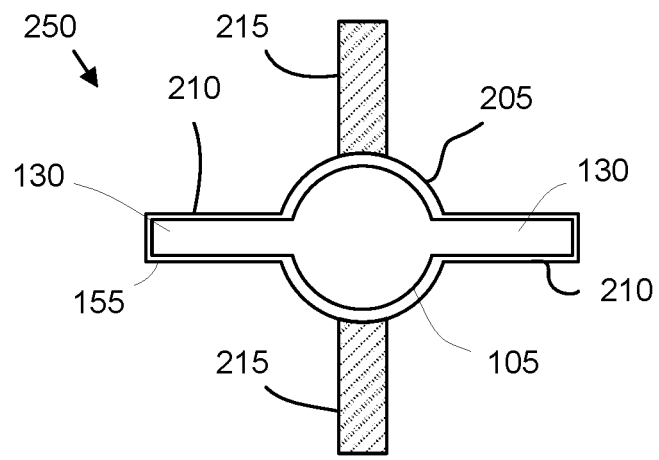
FIG. 2G is a front view drawing of an open position according to an embodiment.

FIG. 2G is a front view drawing of the open position 250. In the depicted embodiment, the latch pin 105 is in the open position 250. As shown in FIG. 2F, the latch pin 105 may pass through the center orifice 205 and the latch wings 130 may pass through the polarized slots 210.

Figure 2H:
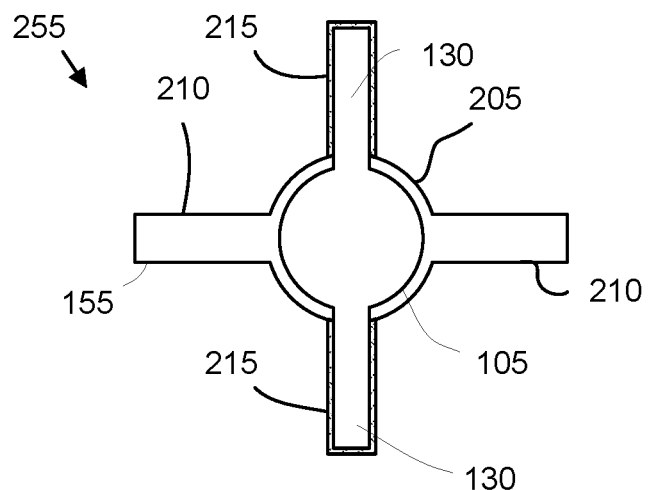
FIG. 2H is a front view drawing of a unit latch position for a unit socket according to an embodiment.

FIG. 2H is a front view drawing of the unit latch position 255 for the unit socket 155. In the depicted embodiment, the latch pin 105 of FIG. 2G is rotated to the unit latch position 255. In the unit latch position 255, the latch wings 130 may be aligned with the wing indentations 215. The bias unit 140 may bias the latch wings 130 in the proximal direction 230 and into the wing indentations 215. In one embodiment, with the latch wings 130 disposed in the wing indentations 215, the latch pin 105 is prevented from rotating from the unit latch position 255. Thus, the unit socket 155 obstructs the latch wing 130 from moving in the proximal direction 230 in the unit latch position 255. The latch pin 105 latches the equipment unit door 180 to the equipment unit 185 in the unit latch position 255. As a result, the equipment unit door 180 is securely latched to the equipment unit 185.

Figure 2I:
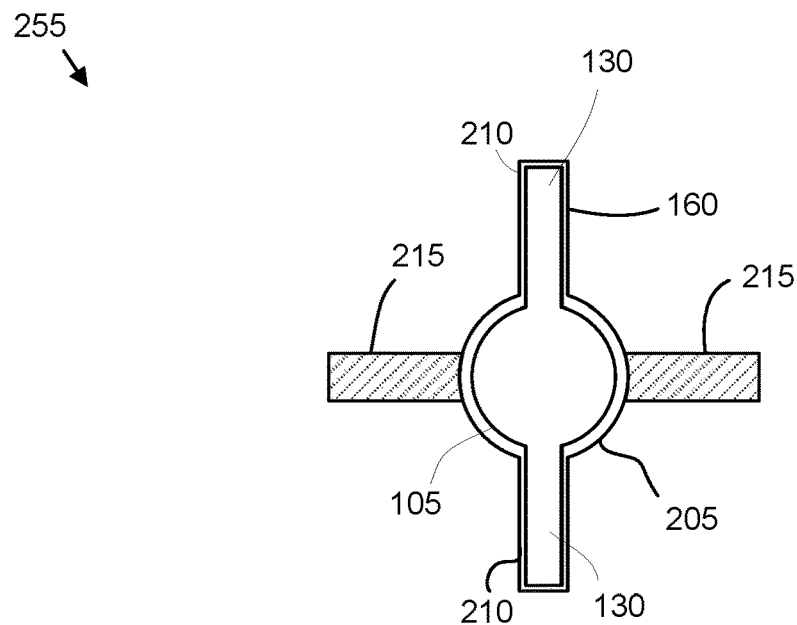
FIG. 2I is a front view drawing of a unit latch position for a structure socket according to an embodiment.

FIG. 2I is a front view drawing of the unit latch position 255 for the structure socket 160. In the depicted embodiment, the latch pin 105 of FIG. 2H is in the unit latch position 255. In the unit latch position 255, the latch wings 130 may be aligned with the polarized slots 210 of the structure socket 160. The latch pin 105 may pass through the center orifice 205 and the latch wings 130 may pass through the polarized slots 210. Thus, the structure socket 160 passes the latch wing 130 in the unit latch position 255.

Figure 2J:
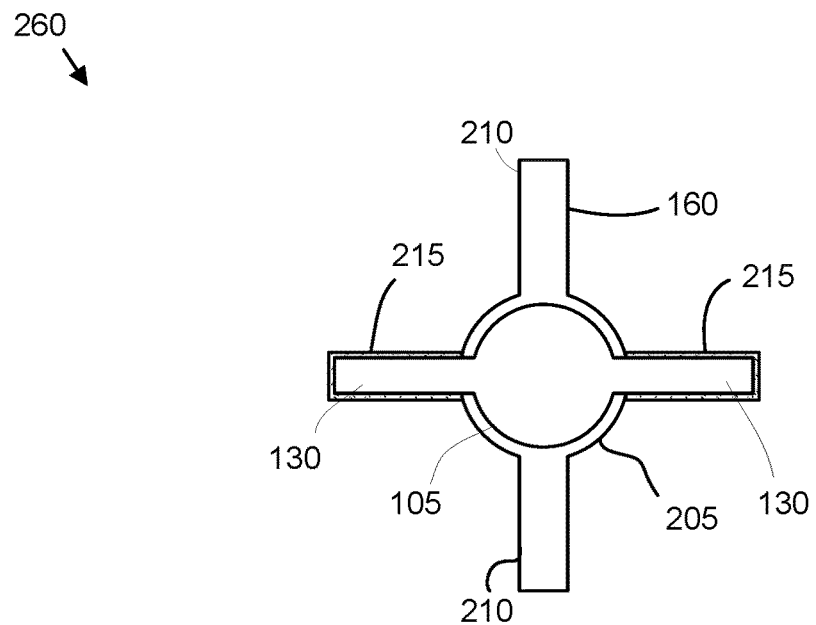
FIG. 2J is a front view drawing of a structure latch position for a structure socket according to an embodiment.

FIG. 2J is a front view drawing of the structure latch position 260 for the structure socket 160. In the depicted embodiment, the latch pin 105 of FIG. 2I is rotated to the structure latch position 260. In the structure latch position, the latch wings 130 may be aligned with the wing indentations 215. The bias unit 140 may bias the latch wings 130 in the proximal direction 230 and into the wing indentations 215. With the latch wings 130 disposed in the wing indentations 215, the latch pin 105 may be prevented from rotating from the structure latch position 260. Thus, the socket structure 160 obstructs the latch wing 130 from moving in the proximal direction 230 in the structure latch position 260. The latch pin 105 may latch the equipment unit 185 to the structure in the structure latch position 260. As a result, the equipment unit 185 is securely latched to the structure.

Figure 2K:
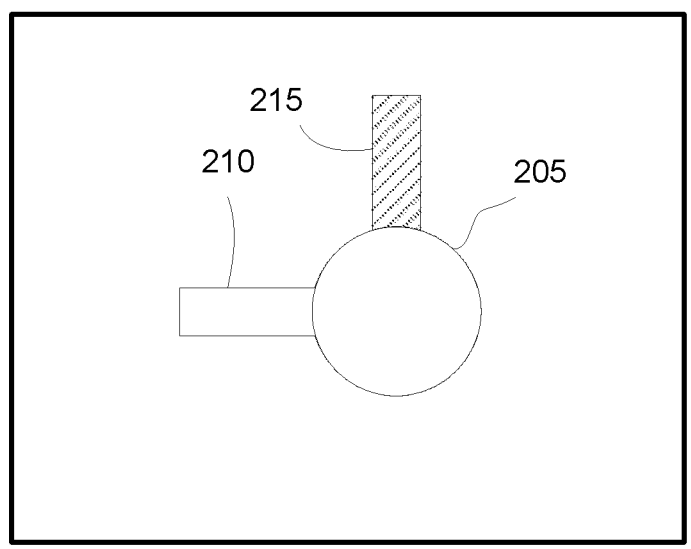
FIG. 2K is a front view drawing of a unit socket according to an alternate embodiment.

FIG. 2K is a front view drawing of an alternate embodiment of the unit socket 155. In the depicted embodiment, the unit socket 155 includes the central orifice 205, one polarized slot 210, and one wing indentation 215. The unit socket 155 may include any number of polarized slots 210 and wing indentations 215.

Figure 2L:
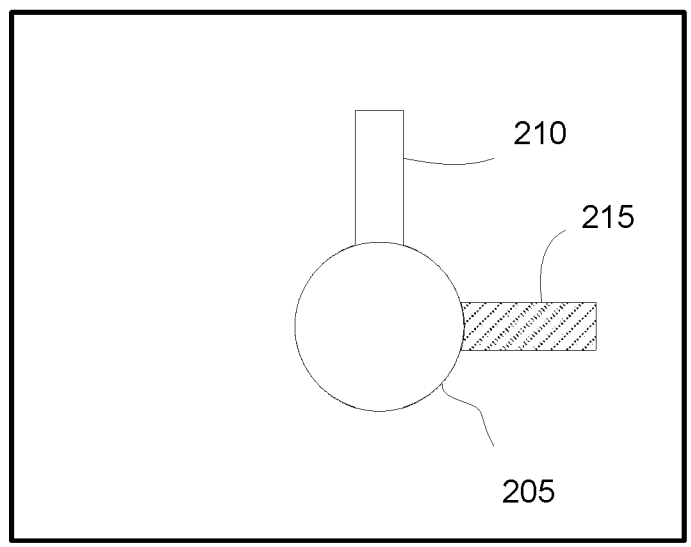
FIG. 2L is a front view drawing of a structure socket according to an alternative embodiment.

FIG. 2L is a front view drawing of an alternate embodiment of the structure socket 160. In the depicted embodiment, the structure socket 160 includes the central orifice 205, one polarized slot 210, and one wing indentation 215. The polarized slot 210 of the structure socket 160 is aligned with the wing indentation 215 of the unit socket 155. As a result, the latch pin 105 may pass through the central orifice 205 and the latch wing 130 may pass through the polarized slot 210 of the structure socket 160 in the unit latch position 255.

Figure 2M:
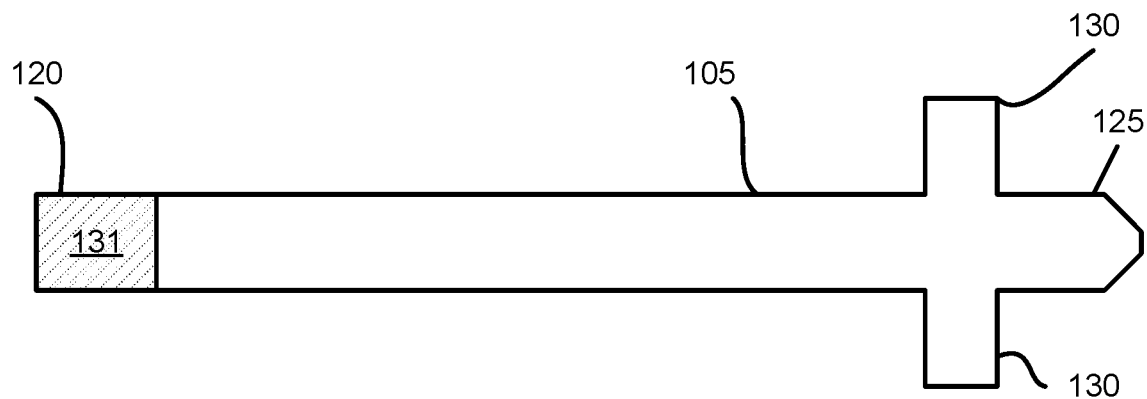
FIG. 2M is a side view drawing of a latch pin with position indicator according to an embodiment.

FIG. 2M is a side view drawing of the latch pin 105 with a position indicator 131. The latch pin 105 may comprise at least one position indicator 131. In the depicted embodiment, the position indicator 131 is a colored portion of the latch pin 105. The colored portion position indicator 131 may be viewed through an indicator hole to indicate the unit latch position 255 as will be described hereafter. In addition, the colored portion position indicator 131 may indicate the structure latch position 260.

Figure 2N:
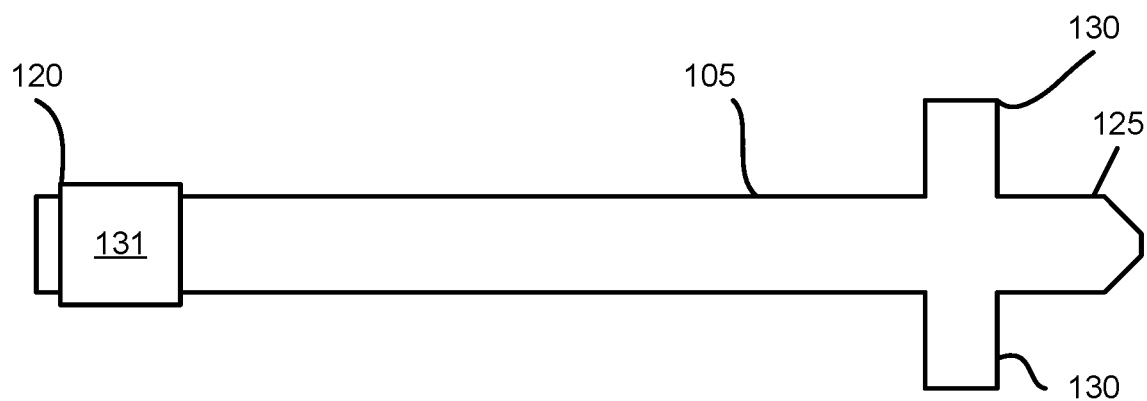
FIG. 2N is a side view drawing of a latch pin with position indicator according to an alternative embodiment.

FIG. 2N is a side view drawing of the latch pin 105 with the position indicator 131. In the depicted embodiment, the position indicator 131 is a colored sleeve that is disposed on the latch pin 105. The colored sleeve position indicator 131 may be viewed through the indicator hole to indicate the unit latch position 255 or the structure latch position 260 as will be described hereafter.

Figure 2O:
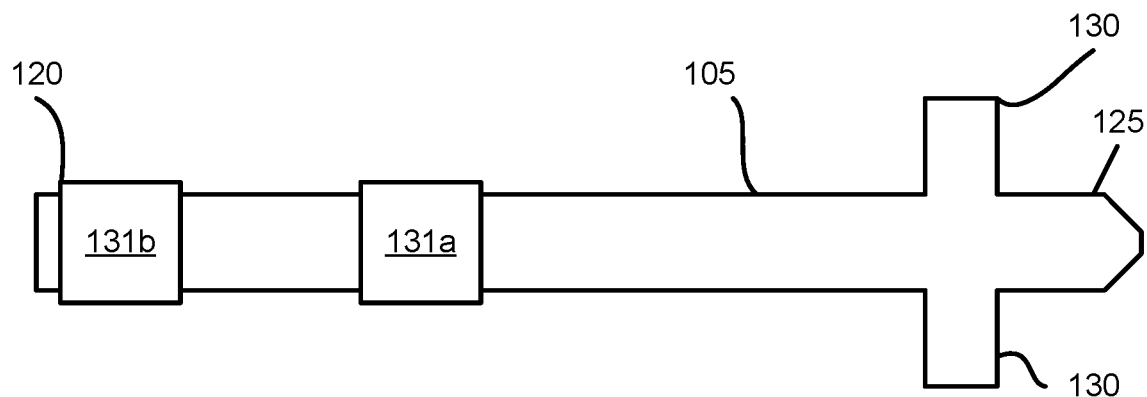
FIG. 2O is a side view drawing of a latch pin with position indicators according to an alternative embodiment.

FIG. 2O is a side view drawing of the latch pin 105 with two position indicators 131a-b. In the depicted embodiment, the position indicators 131a-b are the colored sleeve. The first position indicator 131a may indicate the unit latch position 255 and the second position indicator 131b may indicate the structure latch position 260.

Figure 3A:
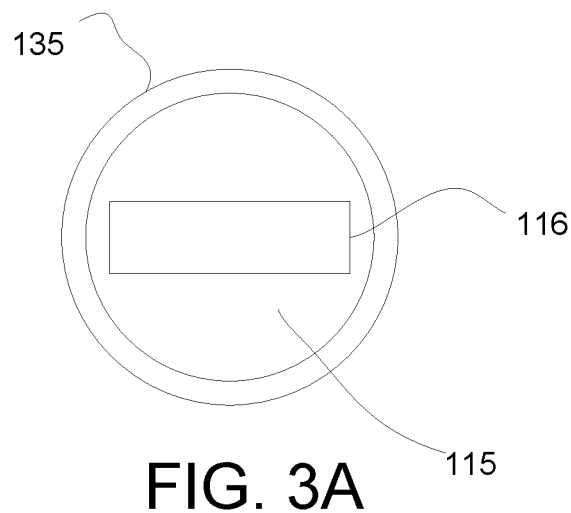
FIG. 3A is a front view drawing of a latch interface according to an embodiment.

FIG. 3A is a front view drawing of the latch interface 115. In the depicted embodiment, the latch interface 115 is disposed within the sleeve 135. The latch interface 115 includes a rectangular indentation 116. The rectangular indentation 116 may receive a rotation tool such as a flat head screwdriver. The rotation tool may be fitted in the rectangular indentation 116 in order to rotate the latch pin 105 from the open position 250 to the unit latch position 255 and to the structure latch position 260.

Figure 3B:
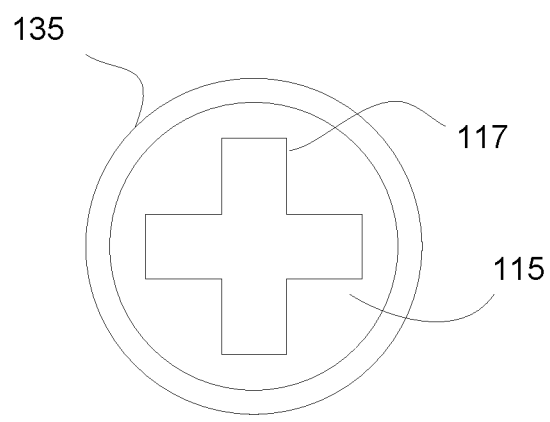
FIG. 3B is a front view drawing of a latch interface according to an alternative embodiment.

FIG. 3B is a front view drawing of an alternative embodiment of the latch interface 155. In the depicted embodiment, the latch interface 155 is disposed within the sleeve 135. The latch interface 115 includes a cross indentation 117. The cross indentation 117 may receive a rotation tool such as a Phillips head screwdriver. The rotation tool may be fitted in the cross indentation 117 in order to rotate the latch pin 105 from the open position 250 to the unit latch position 255 and to the structure latch position 260.

Figure 3C:
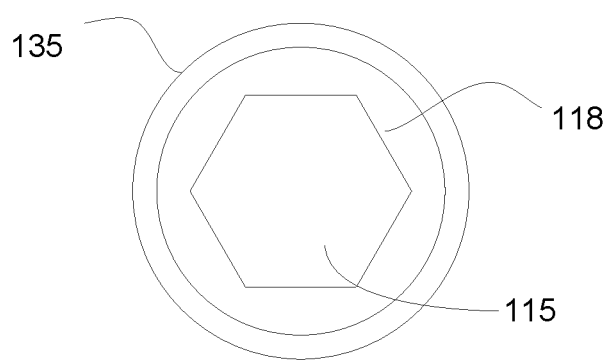
FIG. 3C is a front view drawing of a latch interface according to an alternative embodiment.

FIG. 3C is a front view drawing of an alternative embodiment of the latch interface 155. In the depicted embodiment, the latch interface 155 is disposed within the sleeve 135. The latch interface 115 includes a hexagonal indentation 118. The hexagonal indentation 118 may receive a rotation tool such as a hex driver. The rotation tool may be fitted in the hexagonal indentation 218 and rotate the latch pin 105 from the open position 250 to the unit latch position 255 and to the structure latch position 260.

Figure 3D:
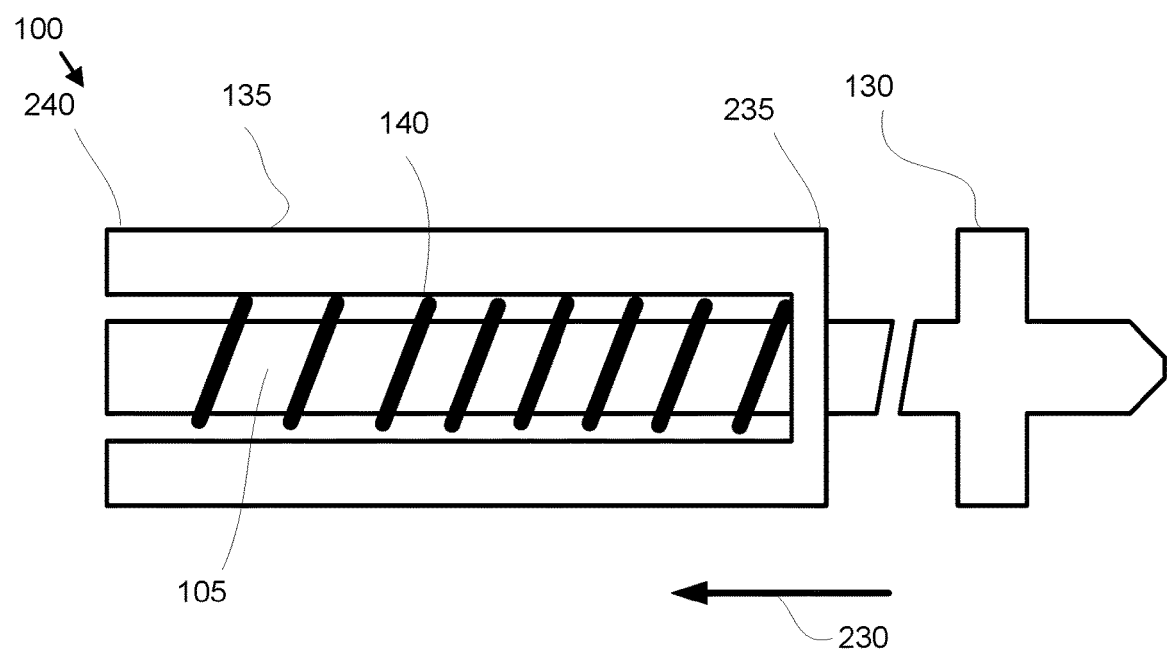
FIG. 3D is a schematic side view cutaway drawing of a latch apparatus with biasing unit according to an embodiment.

FIG. 3D is a schematic side view cutaway drawing of the latch apparatus 100. In the depicted embodiment, a spring biasing unit 140 is disposed within the sleeve 135. The spring biasing unit 140 may bias the latch pin 105 in the proximal direction 230. The sleeve 135 comprises a sleeve proximal end 240 and a sleeve distal end 235. The latch pin 105 is disposed within the sleeve 135.

Figure 3E:
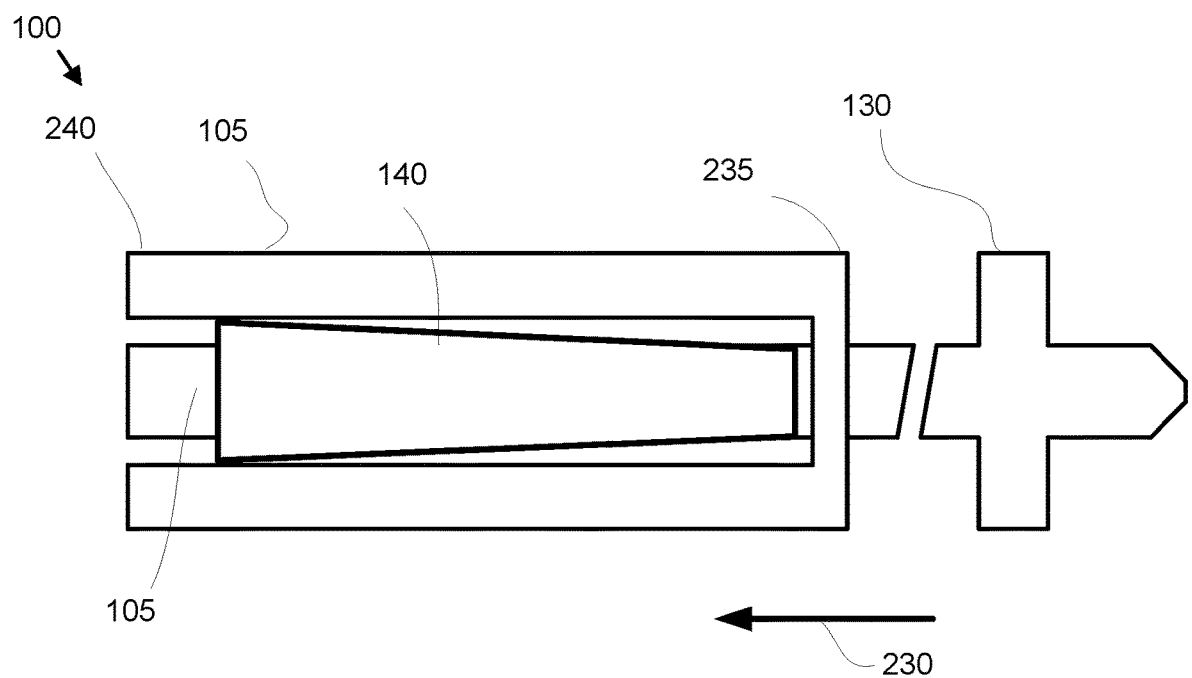
FIG. 3E is a schematic side view cutaway drawing of a latch apparatus with biasing unit according to an alternate embodiment.

FIG. 3E is a schematic side view cutaway drawing of an alternate embodiment of the latch apparatus 100. In the depicted embodiment, an elastic sleeve biasing unit 140 is disposed within the sleeve 135. The elastic sleeve biasing unit 140 may bias the latch pin 105 in the proximal direction 230.

Figure 3F:
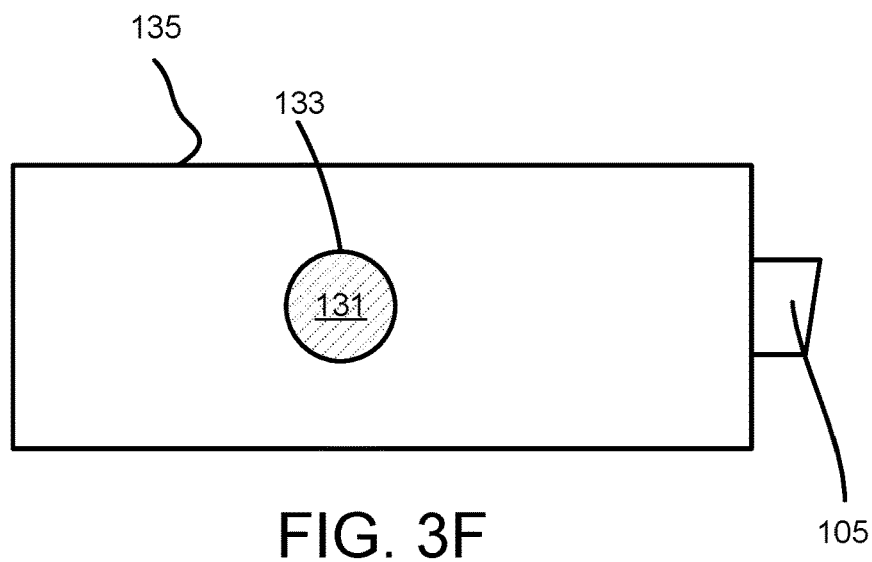
FIG. 3F is a schematic side view drawing of a sleeve with an indicator hole according to an embodiment.

FIG. 3F is a schematic side view drawing of the sleeve 135 with an indicator hole 133. The sleeve 135 may include at least one indicator hole 133. The indicator hole 133 may allow the latch pin 105 to be viewed from outside of the sleeve 135. In the depicted embodiment, the position indicator 131 is visible through the indicator hole 133. In one embodiment, the position indicator 131 is visible through the indicator hole 133 in the unit latch position 255. As a result, a user may ascertain that the latch pin 105 is in the unit latch position 255. In an alternate embodiment, the position indicator 131 is visible through the indicator hole 133 in the structure latch position 260. As a result, the user may ascertain that the latch pin 105 is in the structure latch position 260.

In one embodiment, the unit latch position indicator 131 is visible through the indicator hole 133 in the unit latch position 255. In addition, a structure latch position indicator 131 may be visible through the indicator hole 133 in the structure latch position 260.

Figure 3G:
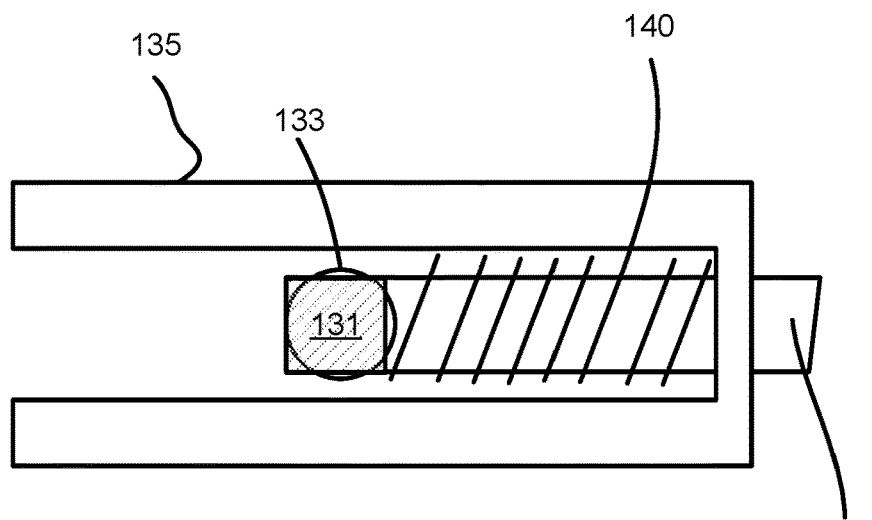
FIG. 3G is a schematic side view cutaway drawing of a sleeve with an indicator hole and position indicator according to an embodiment.

FIG. 3G is a schematic side view cutaway drawing of the sleeve 135 with a position indicator 131 visible through the indicator hole 133. In the depicted embodiment, the position indicator 131 is shown disposed adjacent to the indicator hole 133. As a result, the position indicator 131 is visible through the indicator hole 133 and indicates to the user that the latch pin 105 is in one of the unit latch position 255 and the structure latch position 260.

Figure 3H:
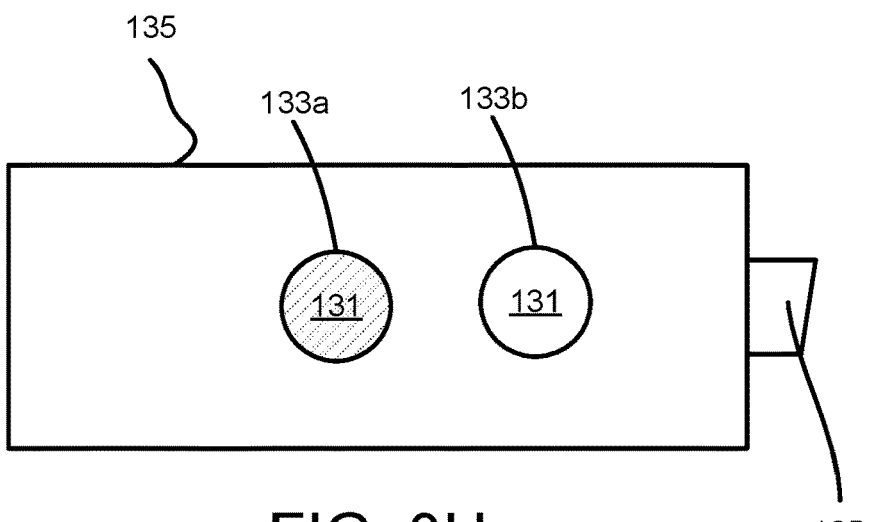
FIG. 3H is a schematic side view drawing of a sleeve with two indicator holes according to an embodiment.

FIG. 3H is a schematic side view drawing of the sleeve 135 with two indicator holes 133. In the depicted embodiment, the position indicator 131 is visible through a first indicator hole 133a, indicating that the latch pin 105 is in the unit latch position 255. If the position indicator 131 were visible through the second indicator hole 133b, the position indicator 131 would indicate that the latch pin 105 was in the structure latch position 260.

Figure 4A:
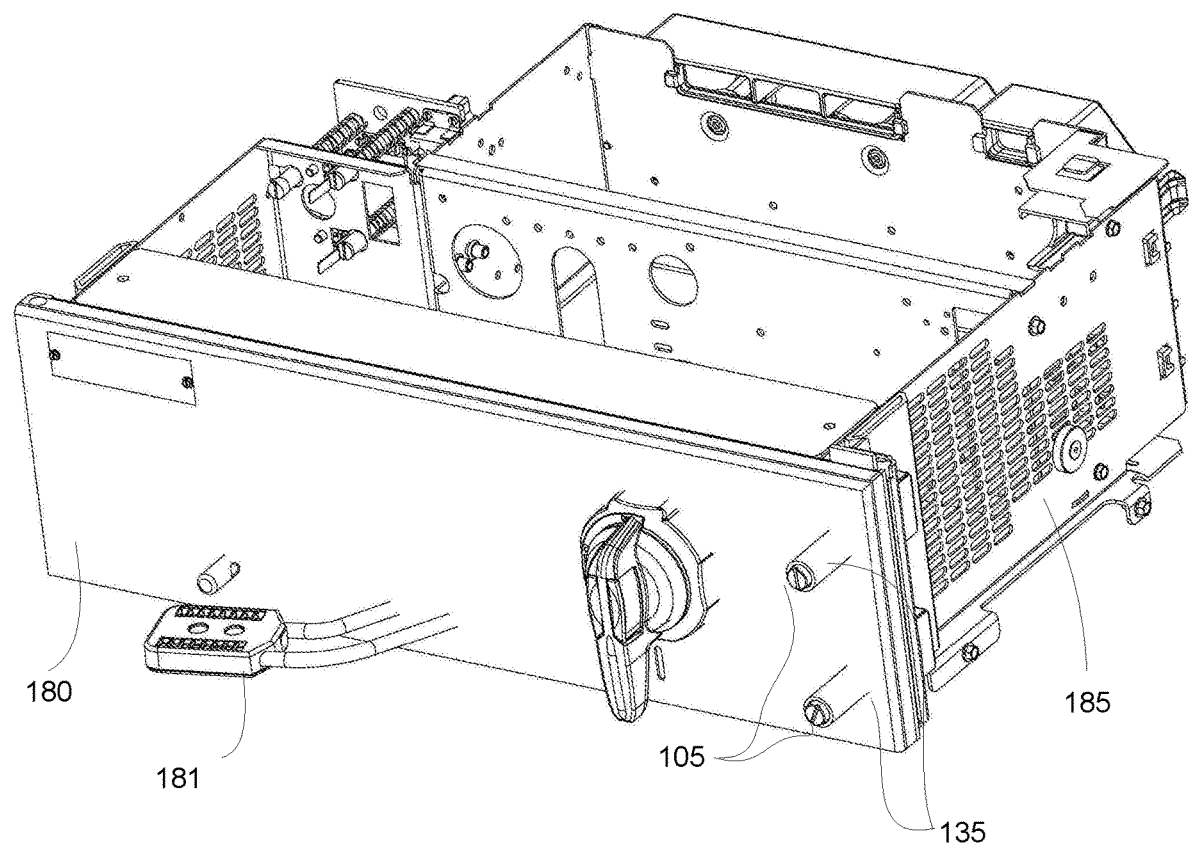
FIG. 4A is a perspective drawing illustrating an equipment unit according to an embodiment.

FIG. 4A is a perspective drawing illustrating one embodiment of the equipment unit 185. In the depicted embodiment, the equipment unit 185 includes a removal lever 181, the equipment unit door 180, and two sleeves 135 with latch pins 105 disposed within. The removal lever 181 may be used to extract the equipment unit 185 from a structure. The latch pins 105 may allow the equipment unit door 180 to be opened in the open position 250. In addition, the latch pins 105 may obstruct the equipment unit door 180 from being opened in the unit latch position 255. The equipment unit door 180 may only be opened if the latch pin 105 is in the open position 250.

Figure 4B:
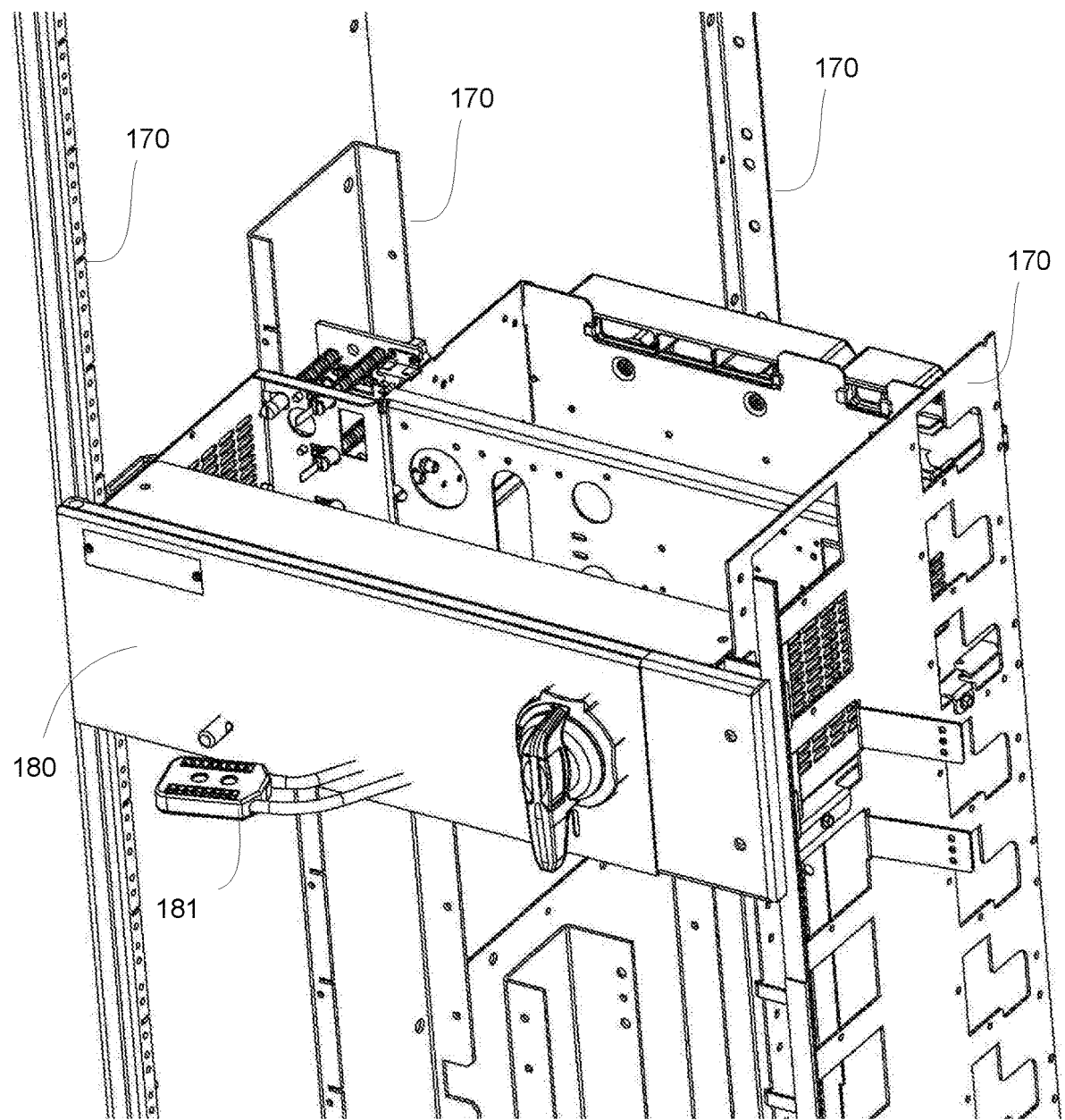
FIG. 4B is a perspective drawing illustrating a structure with an equipment unit according to an embodiment.

FIG. 4B is a perspective drawing illustrating the equipment unit 185 disposed in the structure 170. The structure 170 may be an equipment rack, an equipment cabinet, and the like. The equipment unit 185 should not be removed from the structure 170 except when expressly desired by the user. The latch pins 105 may permit the equipment unit 185 to be removed from the structure 170 in the open position 250 and/or in the unit latch position 255. However, the equipment unit door 180 may not be opened in the unit latch position 255. As a result, the equipment unit 185 may be removed from the structure 170 while the equipment unit door 180 remains securely latched. The equipment unit 185 may not be removed from the structure 170 in the structure latch position 260.

Figure 4C:
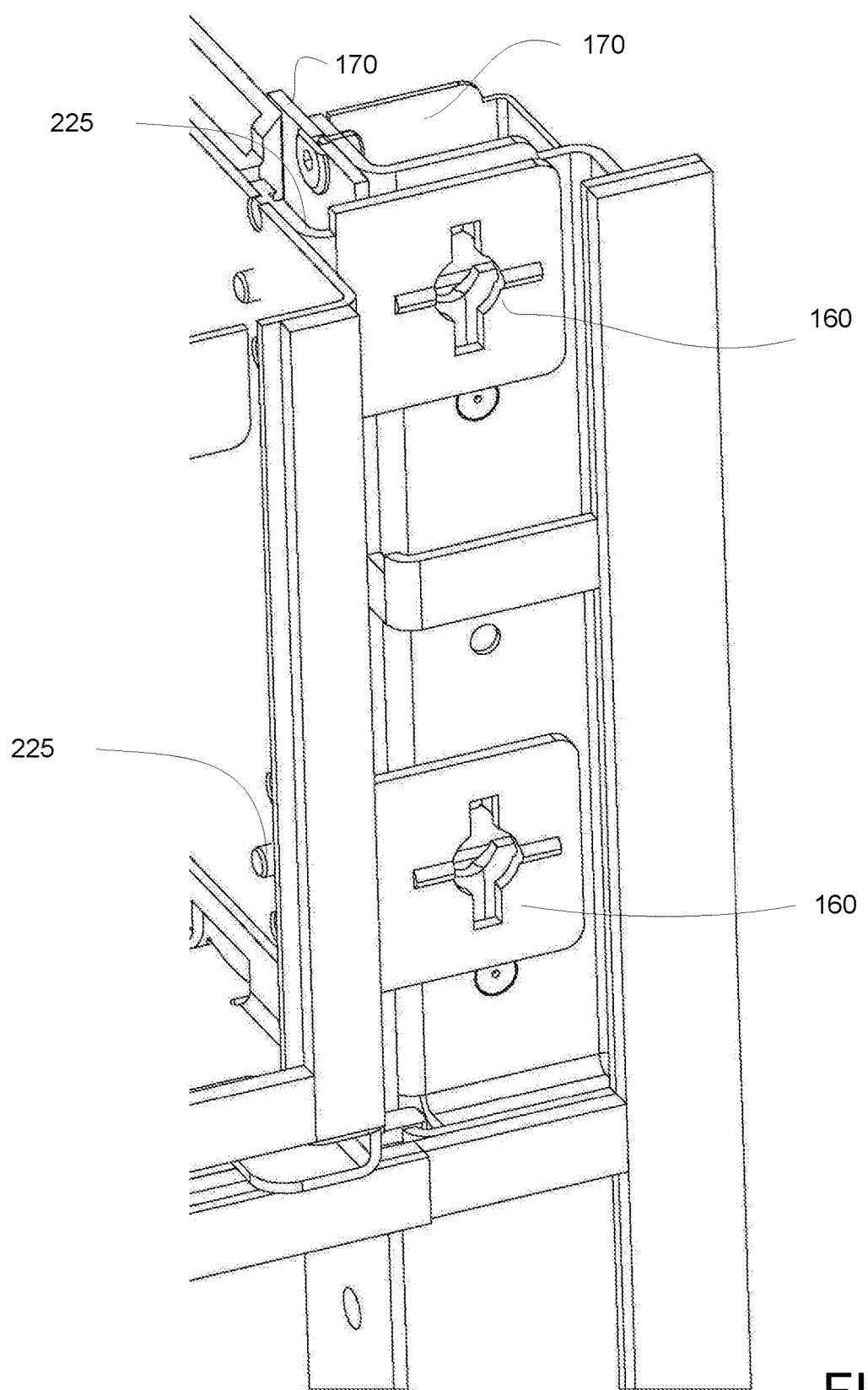
FIG. 4C is a perspective drawing illustrating a structure with structure sockets according to an embodiment.

FIG. 4C is a perspective drawing illustrating one embodiment of the structure 170 with the structure sockets 160. In the depicted embodiment, the structure sockets 160 are disposed on a structure bracket 225 and attached to the structure 170.

Figure 5A:
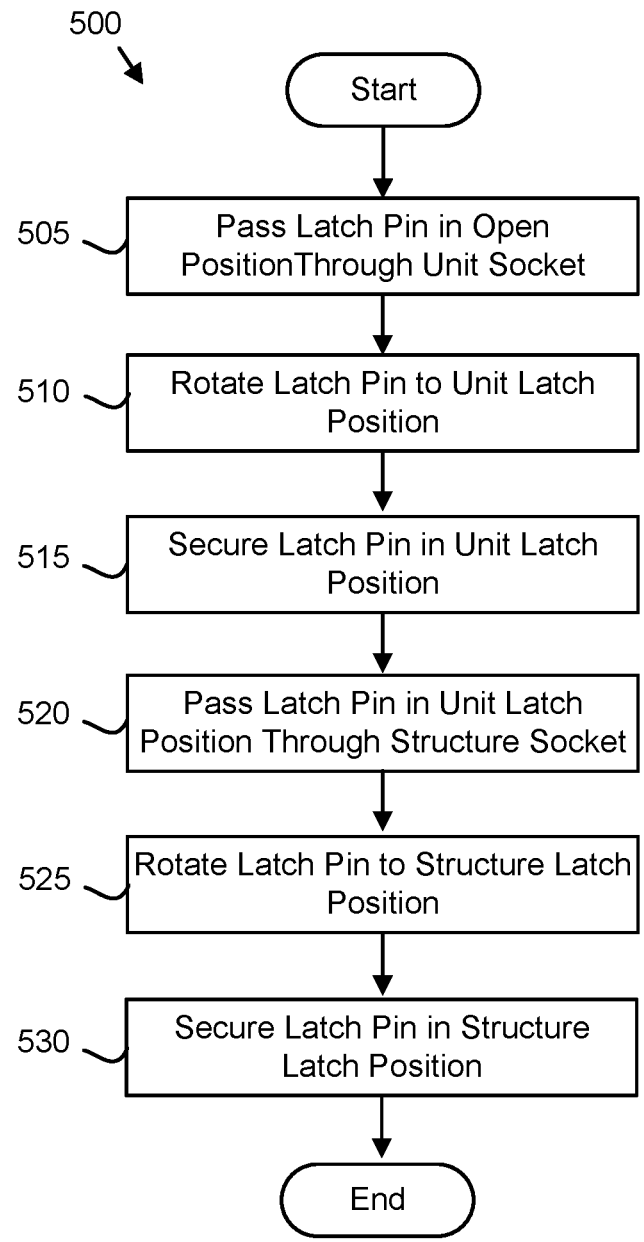
FIG. 5A is a schematic flow chart diagram illustrating a locking method according to an embodiment.

FIG. 5A is a schematic flow chart diagram illustrating one embodiment of a locking method 500. The method 500 may latch the equipment unit door 180 to the equipment unit 185 in the unit latch position 255. In addition, the method 500 may latch the equipment unit 185 to the structure 170.

The method 500 starts, and in one embodiment, the latch pin 105 passes 505 in the open position 250 through the unit socket 155. The latch pin 105 may be pushed against the force of the biasing unit 140 through the unit socket 155.

The latch pin 105 may further be rotated 510 to the unit latch position 255. In one embodiment, the biasing unit 140 may bias the latch pin 105 in the proximal direction 230 such that the latch wings 130 are disposed in the wing indentations 215 of the unit socket 155. As a result, the latch pin 105 may be secured 515 in the unit latch position 255. With the latch pin 105 secured 515 in the unit latch position 255, the equipment unit door 180 may be securely latched to the equipment unit 185.

The latch pin 105 may further pass 520 in the unit latch position 255 through the structure socket 160. The latch pin 105 may be rotated 525 to the structure latch position 260. The biasing unit 140 may bias the latch pin 105 in the proximal direction 230 such that the latch wings 130 are disposed in the wing indentations 215 of the structure socket 160. As a result, the latch pin 105 may be secured 530 in the structure latch position 260. With the latch pin 105 secured 530 in the structure latch position 260, the equipment unit 185 may be securely latched to the structure 170 and the method 500 ends.

Figure 5B:
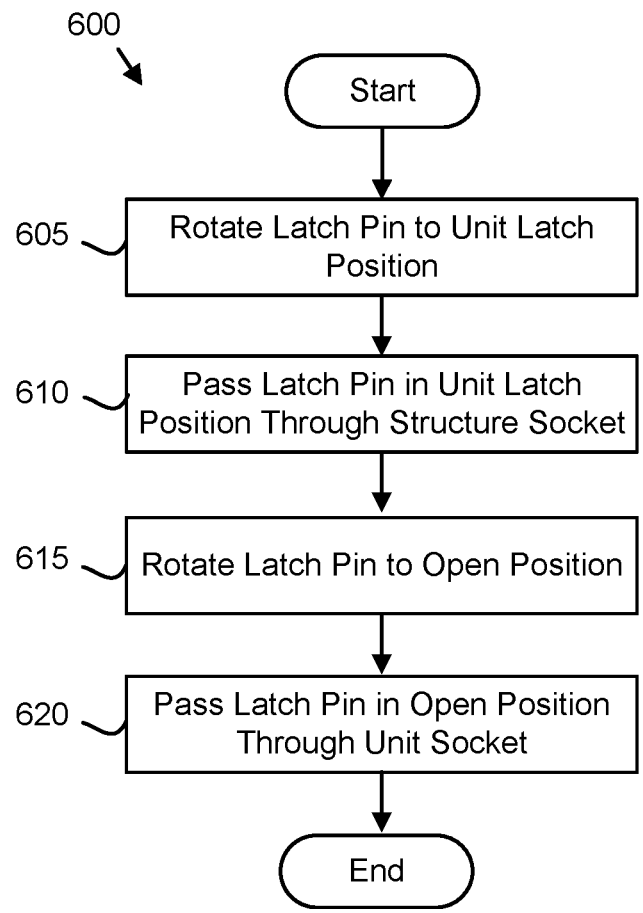
FIG. 5B is a schematic flow chart diagram illustrating an unlocking method according to an embodiment.

FIG. 5B is a schematic flow chart diagram illustrating an unlocking method 600. The method 600 may unlatch the latching pin 105 from the structure latch position 260 and/or the unit latch position 255.

The method 600 starts, and in one embodiment, the latch pin 105 is rotated 605 from the structure latch position 260 to the unit latch position 255. In one embodiment, the latch pin 105 is pushed opposite the proximal direction 230 so that the latch wings 130 disengage from the wing indentations 215 of the socket structure 160 and the latch pin 105 can be rotated 605.

The latch pin 105 further passes 610 in the unit latch position 255 through the structure socket 160 in the proximal direction 230. The biasing unit 140 may push the latch pin 105 through the structure socket 160. As a result, the equipment unit 185 may be removed from the structure 170.

In one embodiment, the latch wings 130 come to rest with in the wing indentations 215 of the unit structure 155. The latch pin 105 may further rotate 615 to the open position 250. In one embodiment, the latch pin 105 is pushed opposite the proximal direction 230 so that the latch wings 130 disengage from the wing indentations 215 of the unit socket 160 and the latch pin 105 can be rotated 615.

The latch pin 105 passes 620 in the open position 250 through the unit socket 155. The biasing unit 140 may push the latch pin 105 through the unit socket 155. As a result, the equipment unit door 180 may be opened. In addition, the equipment unit 185 may be removed from the structure 170 and the method 600 ends.

PROBLEM/SOLUTION

Equipment units 185 often include internal hardware that is dangerous to users. The internal hardware may include strong electrical currents, high voltages, moving parts, and the like. As a result, the equipment unit door 180 should be securely latched so that no user is inadvertently exposed to the internal hardware. However, qualified users must often access the internal hardware within the equipment unit 185 such as to perform diagnostics or repairs. Therefore, the equipment unit door 180 must be readily unlatched when access is needed. In addition, the equipment unit 185 may be disposed in a structure 170. The equipment unit 185 should typically be latched to the structure 170 so that the equipment unit 185 is not inadvertently removed from the structure.

The embodiments allow a latch pin 105 to both securely latch the equipment unit door 180 to the equipment unit 185 and secure latch the equipment unit 180 to the structure 170. So latched in the unit latch position 255, the equipment unit door 185 cannot be opened without moving the latch pin 105 to the open position 250. In addition, the equipment unit 185 cannot be removed from the structure 170 while the latch pin 105 is in the structure latch position 260. The equipment unit 185 can only be removed from the structure 170 by rotating the latch pin 105 to the unit latch position 255. Thus, the latch pin 105 both latches the equipment unit door 180 to the equipment unit 185 and latches the equipment unit 185 to the structure 170.

This description uses examples to disclose the invention and also to enable any person skilled in the art to practice the invention, including making and using any devices or systems and performing any incorporated methods. The patentable scope of the invention is defined by the claims and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. An apparatus comprising:
    an equipment door pivotally mounted on an equipment unit;
    a latch pin comprising a latch shaft with a latch interface disposed on a pin proximal end and a latch wing disposed on a pin distal end wherein the latch pin is disposed on the equipment unit door, the latch pin further comprising a unit position indicator and a structure latch indicator on the latch shaft,
    A sleeve disposed on the equipment unit door and comprising a sleeve proximal end and a sleeve distal end, wherein the latch pin is disposed within the sleeve, the sleeve comprises an indicator hole and the unit latch position indicator is visible through the indicator hole in the unit latch position and the structure latch position indicator is visible through the indicator hole in the structure latch position,
    a biasing unit that biases the latch pin toward the sleeve proximal end with a torsion flange, wherein the latch pin rotates to one of an open position, a unit latch position, and a structure latch position,
    a unit disposed on a unit bracket attached to the equipment unit, the unit socket that passes the latch wing in the open position, and that obstructs The latch wing from moving in a proximal direction in the unit latch position securing the equipment door to the equipment unit; and
    a structure socket disposed on a structure bracket attached to a structure;
    wherein, after the latch pin is secured to the unit socket, the equipment unit is configured to be mounted to the structure so that the structure socket is aligned with the unit socket and configured to allow further passing of the latch wing in the structure latch position, and that obstructs the latch wing from moving in the proximal direction in the structure latch position securing the equipment door and the equipment unit with the structure.

2. The apparatus of claim 1, wherein the latch pin latches the equipment unit door to the equipment unit in the unit latch position.

3. The apparatus of claim 1, wherein the latch pin latches the equipment unit door to the equipment unit in the unit latch position and latches the equipment unit to the structure in the structure latch position.

4. The apparatus of claim 1, wherein the sleeve distal end is connected to the equipment unit door.

5. The apparatus of claim 4, wherein the biasing unit is selected from the group consisting of a coil spring, an elastic sleeve, and a torsion flange.

6. The apparatus of claim 1, wherein the unit socket and the structure socket each comprise a center orifice that the latch pin passes through, a polarized slot that the latch wing passes through, and a wing indentation that the latch wing is disposed within during one of the unit latch position and the structure latch position.

7. The apparatus of claim 1, wherein the unit socket is disposed on a unit bracket and is attached to the equipment unit.

8. The apparatus of claim 1, wherein the structure socket is disposed on a structure bracket and is attached to the structure.

9. A system comprising:
    a structure;
    an equipment unit disposed in the structure and comprising an equipment unit door pivotally mounted on the equipment unit;
    a latch pin comprising a latch shaft with a latch interface disposed on a pin proximal end and a latch wing disposed on a pin distal end, wherein the latch pin is disposed on the equipment unit door, the latch pin further comprising a unit position indicator and a structure latch indicator on the latch shaft;
    a sleeve disposed on the equipment unit door and comprising a sleeve proximal end and a sleeve distal end, wherein the latch pin is disposed within the sleeve, the sleeve comprises an indicator hole, and the unit latch position indicator is visible through the indicator hole in the unit latch position and the structure latch position indicator is visible through the indicator hole in the structure latch position;
    a biasing unit that biases the latch pin toward the sleeve proximal end with a torsion flange, wherein the latch pin rotates to one of an open position, a unit latch position, and a structure latch position;
    a unit socket disposed on a unit bracket attached to the equipment unit, the unit socket that passes the latch wing in the open position, and that obstructs the latch wing from moving in a proximal direction in the unit latch position, securing the equipment door to the equipment unit, and
    a structure socket disposed on a structure bracket attached to the structure;
    wherein, after the latch pin is secured to the unit socket, the equipment unit is configured to be mounted to the structure so that the structure socket is aligned with the unit socket and configured to allow further passing of the latch wing in the structure latch position, and that obstructs the latch wing from moving in the proximal direction in the structure latch position, securing the equipment door and the equipment unit with the structure.

10. The system of claim 9, wherein the latch pin latches the equipment unit to the structure latch position.

11. The system of claim 9, wherein the sleeve distal end is connected to the equipment unit door.

12. The system of claim 9, wherein the biasing unit is selected from the group consisting of a coil spring, an elastic sleeve, and a torsion flange.

13. The system of claim 9, wherein the unit socket and the structure socket each comprise a center orifice that the latch pin passes through, a polarized slot that the latch wing passes through, and a wing indentation that the latch wing is disposed within during one of the unit latch position and the structure latch position.

14. The system of claim 9, wherein the unit socket is disposed on a unit bracket and is attached to the equipment unit.

15. The system of claim 9, wherein the structure socket is disposed on a structure bracket and is attached to the structure.

16. A method comprising:
- providing an equipment door pivotally mounted on an equipment unit;
- providing a latch pin comprising a latch shaft with a latch interface disposed on a pin proximal end and a latch wing disposed on a pin distal end, wherein the latch pin is disposed on the equipment unit door, the latch pin further comprising a unit position indicator and a structure latch indicator on the latch shaft;
- Providing a sleeve disposed on the equipment unit door and comprising a sleeve proximal end and a sleeve distal end, wherein the latch pin is disposed within the sleeve, the sleeve comprises an indicator hole, and the unit latch position indicator is visible through the indicator hole in the unit latch position and the structure latch position indicator is visible through the indicator hole in the structure latch position;
- providing a biasing unit that biases the latch pin toward the sleeve proximal end with a torsion flange, wherein the latch pin rotates to one of an open position, a unit latch position, and a structure latch position;
- providing a unit socket disposed on a unit bracket attached to the equipment unit, the unit socket that passes the latch wing in the open position, and that obstructs the latch wing from moving in a proximal direction in the unit latch position, securing the equipment door to the equipment unit;
- providing a structure socket disposed on a structure bracket attached to a structure;
- wherein, after the latch pin is secured to the unit socket, the equipment unit is configured to be mounted to the structure so that the structure socket is aligned with the unit socket and configured to allow further passing of the latch wine in the structure latch position, and that obstructs the latch wing from moving in the proximal direction in the structure latch position, securing the equipment door and the equipment unit with the structure;
- passing the latch pin in the open position through the unit socket; and
- rotating the latch pin to the unit latch position.

* * * * *